(12) United States Patent
Yu et al.

(10) Patent No.: US 11,381,230 B2
(45) Date of Patent: Jul. 5, 2022

(54) MICROELECTROMECHANICAL TUNABLE DELAY LINE CIRCUIT

(71) Applicant: Northeastern University, Boston, MA (US)

(72) Inventors: Yao Yu, San Mateo, CA (US); Matteo Rinaldi, Boston, MA (US)

(73) Assignee: Northeastern University, Boston, MA (US)

( * ) Notice: Subject to any disclaimer, the term of this patent is extended or adjusted under 35 U.S.C. 154(b) by 0 days.

(21) Appl. No.: 17/368,173

(22) Filed: Jul. 6, 2021

(65) Prior Publication Data

US 2022/0077848 A1 Mar. 10, 2022

Related U.S. Application Data

(60) Provisional application No. 63/074,724, filed on Sep. 4, 2020.

(51) Int. Cl.
*H03K 5/14* (2014.01)
*H03H 9/15* (2006.01)
*H03K 5/145* (2006.01)
*H03K 5/00* (2006.01)

(52) U.S. Cl.
CPC .............. *H03K 5/14* (2013.01); *H03H 9/15* (2013.01); *H03K 5/145* (2013.01); *H03H 2009/155* (2013.01); *H03K 2005/00019* (2013.01)

(58) Field of Classification Search
None
See application file for complete search history.

(56) References Cited

U.S. PATENT DOCUMENTS

| | | | | |
|---|---|---|---|---|
| 2,193,491 A | * | 3/1940 | Reinartz | H03B 19/10 331/184 |
| 3,859,544 A | * | 1/1975 | Nero | H04N 5/208 348/E5.076 |
| 6,222,409 B1 | * | 4/2001 | Kieda | H03H 11/26 327/337 |
| 7,082,171 B1 | * | 7/2006 | Johnson | H03D 7/00 375/316 |
| 7,612,587 B2 | * | 11/2009 | Cheng | G11C 7/222 327/99 |
| 8,704,575 B2 | * | 4/2014 | Hur | H01P 5/18 327/231 |
| 8,981,875 B2 | * | 3/2015 | Park | H01P 1/2084 333/132 |

(Continued)

OTHER PUBLICATIONS

D. Yang, C. Andrews and A. Molnar, "Optimized Design of N-Phase Passive Mixer-First Receivers in Wideband Operation," in IEEE Transactions on Circuits and Systems I: Regular Papers, vol. 62, No. 11, pp. 2759-2770, Nov. 2015, doi: 10.1109/TCSI.2015.2479035. (Year: 2015).*

(Continued)

*Primary Examiner* — Daniel C Puentes
*Assistant Examiner* — Khareem E Almo
(74) *Attorney, Agent, or Firm* — Verrill Dana, LLP

(57) ABSTRACT

Tunable delay circuit devices have an input port, an output port, at least three parallel paths connecting the input port and the output port, on each path, an input switch and an output switch, and on each path, a plurality of shunt resonant tanks connected between the input switch and the output switch, each shunt resonant tank periodically chargeable from the input port and dischargeable to the output port by operation of the input switch and the output switch.

16 Claims, 10 Drawing Sheets

(56) References Cited

U.S. PATENT DOCUMENTS

| | | | |
|---|---|---|---|
| 9,935,608 B1 | 4/2018 | Rinaldi et al. | |
| 2010/0148636 A1* | 6/2010 | Nishihara | H03H 9/02157 310/365 |
| 2012/0286892 A1* | 11/2012 | Gu | H04B 1/525 333/17.1 |
| 2015/0288392 A1* | 10/2015 | Floyd | H03H 19/002 375/130 |
| 2016/0164481 A1* | 6/2016 | Madan | H03H 7/1775 333/185 |
| 2017/0149411 A1* | 5/2017 | Nielsen | H03H 11/1291 |
| 2018/0287047 A1 | 10/2018 | Rinaldi et al. | |
| 2021/0305968 A1* | 9/2021 | Nielsen | H03H 7/1775 |

OTHER PUBLICATIONS

Yu et al., "2.5 GHz Highly-Linear Magnetic Free Microelectromechanical Resonant Circulator", Proc. IEEE Int. Freq. Cont. Symp.(IFCS 2018), 3 pages, 2018.

Yu et al., "Magnetic-free radio frequency circulator based on spatiotemporal commutation of MEMS resonators", 2018 EEE Micro Electro Mechanical Systems (MEMS) (pp. 154-157). IEEE.

Cassella et al., "Radio Frequency Angular Momentum Biased Quasi-LTI Nonreciprocal Acoustic Filers", IEEE Trans Ultrason Ferroelectr Freq Control. Nov. 2019;66(11): 13 pages, doi: 10.1109/TUFFC.2019.2931121. Epub Jul. 25, 2019. PMID: 31352343.

Michetti et al., "A Quasi-LTI Frequency-Selective SAW Circulator", IEEE International Ultrasonic Symposium, 2018, 5 pages.

Michetti et al., "Reconfigurable N-Path MEMS Filter Based on the Periodic Commutation of Single Frequency Resonators", Mar. 2020, DOI:10.1109/MEMS46641.2020.9056403; Conference: MEMS2020, 5 pages.

Pirro et al., "Novel topology for a non-reciprocal MEMS filter", IEEE International Ultrasonics Symposium (IUS) 2018, Kobe, Japan, Oct. 22-25, 2018, 4 pages, doi: 10.1109/ULTSYM.2018. 8580092.

Rinaldi et al., "Super-high-frequency two-port AlN contour-mode resonators for RF applications," Ultrasonics, Ferroelectrics and Frequency Control, IEEE Transactions on, vol. 57, No. 1, pp. 38-45, Jan. 2010.

\* cited by examiner

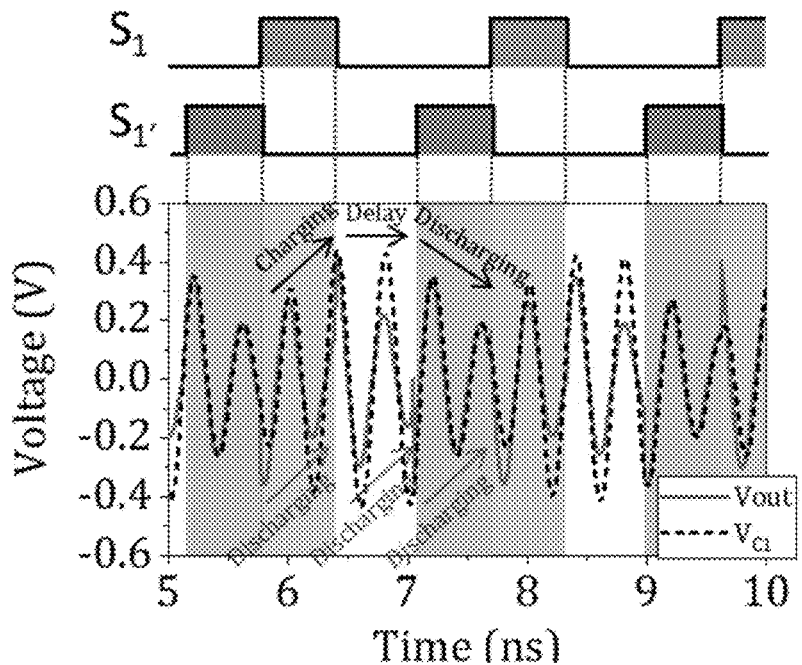
FIG. 5
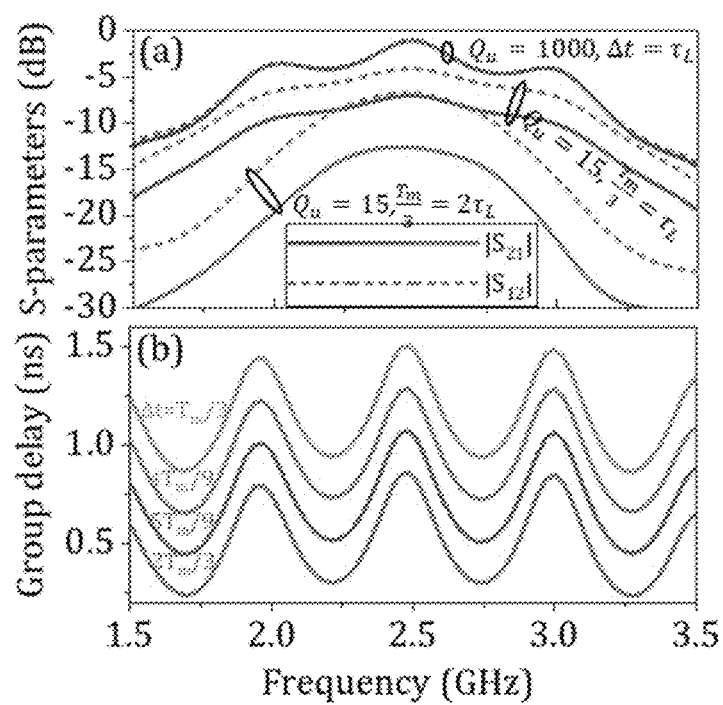
FIG. 6(a)
FIG. 6(b)

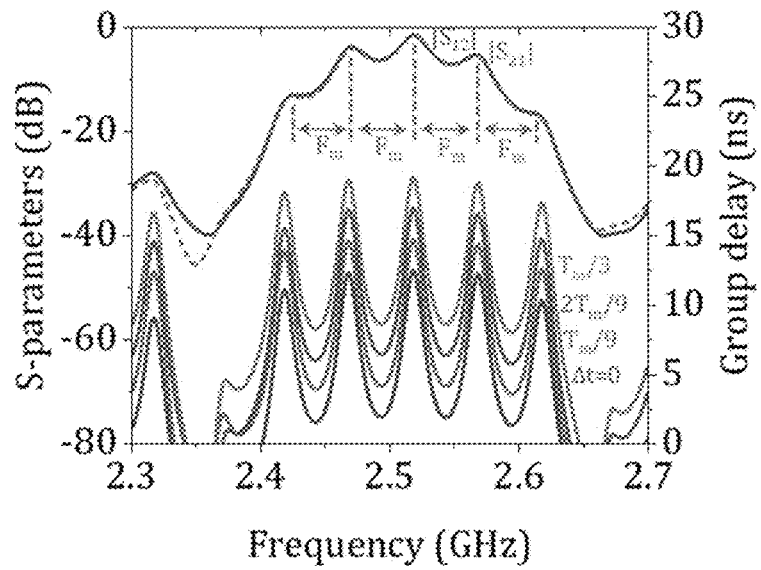
FIG. 9
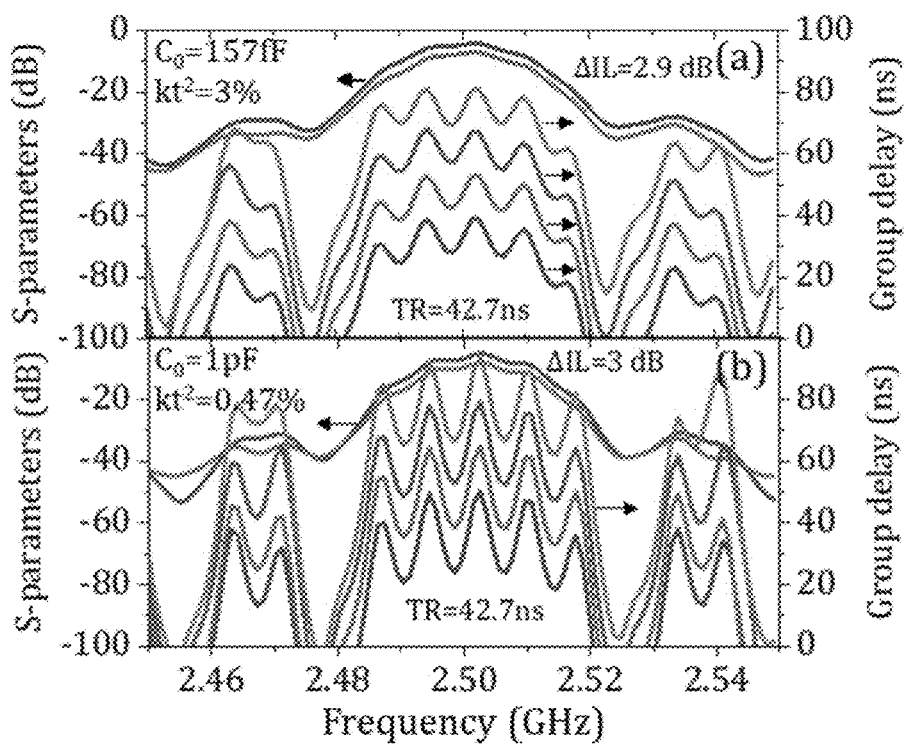
FIG. 10(a)
FIG. 10(b)

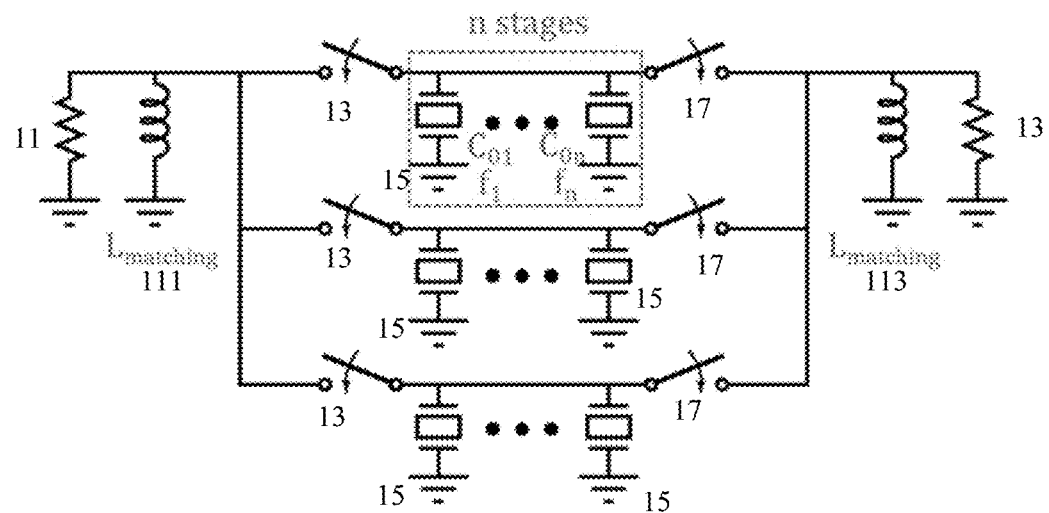
FIG. 11
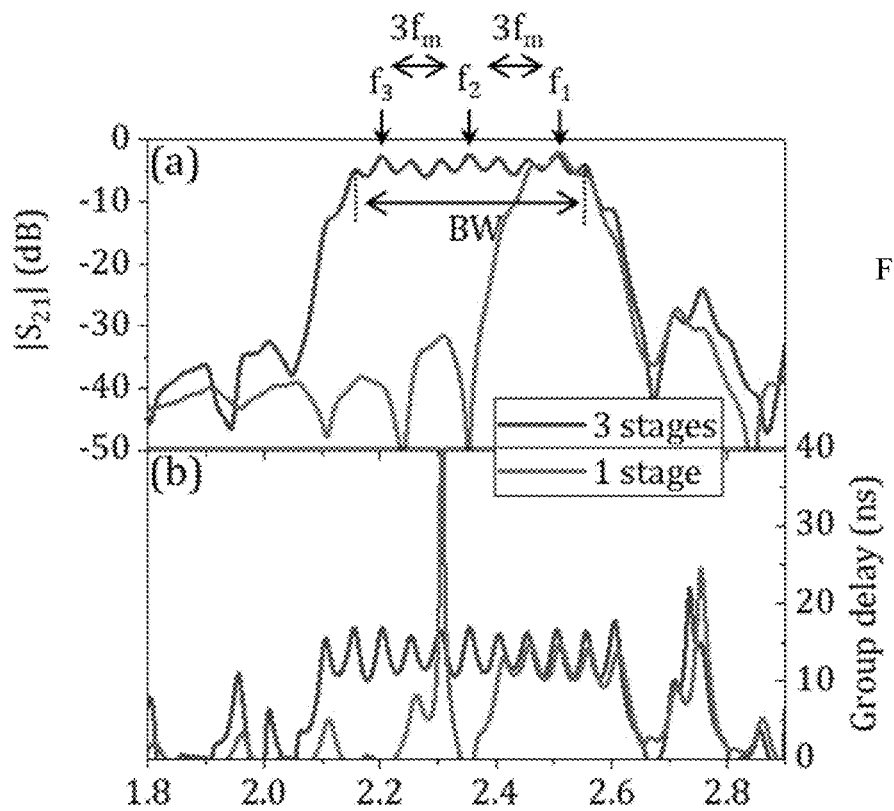
FIG. 12(a)
FIG. 12(b)

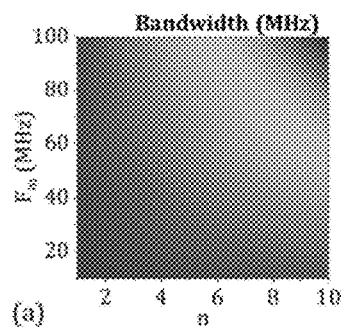
FIG. 13(a)
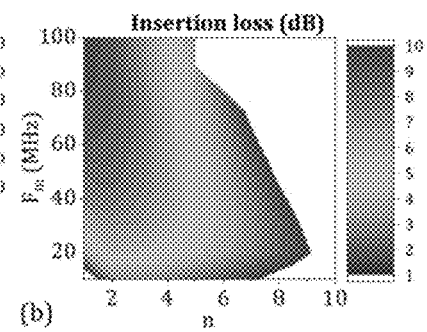
FIG. 13(b)
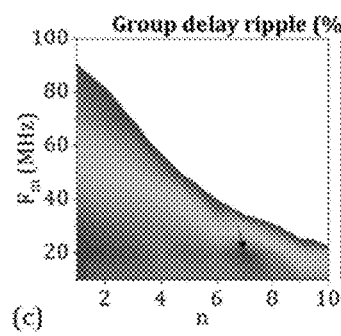
FIG. 13(c)
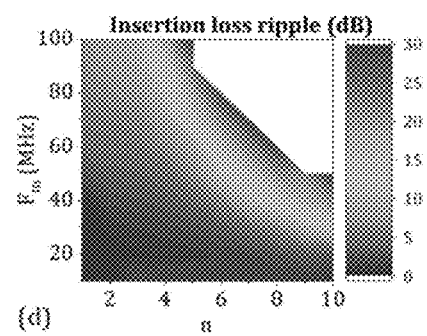
FIG. 13(d)
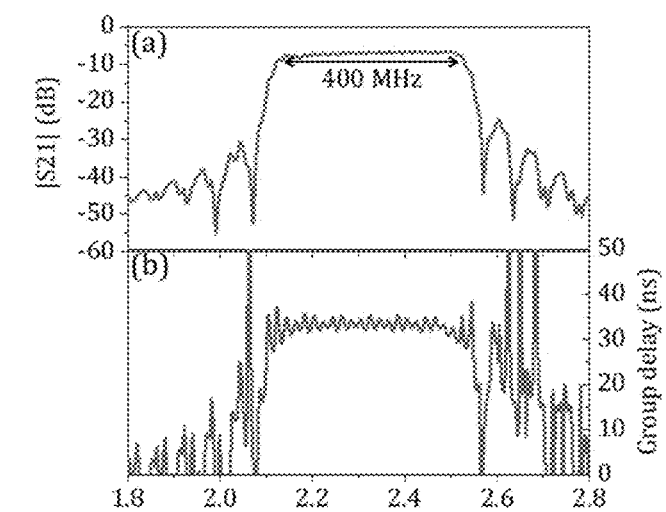
FIG. 14(a)
FIG. 14(b)

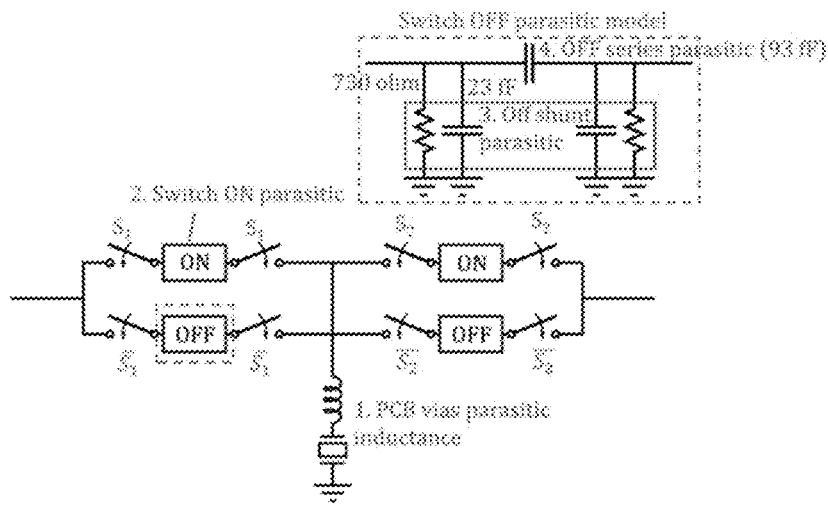
FIG. 17
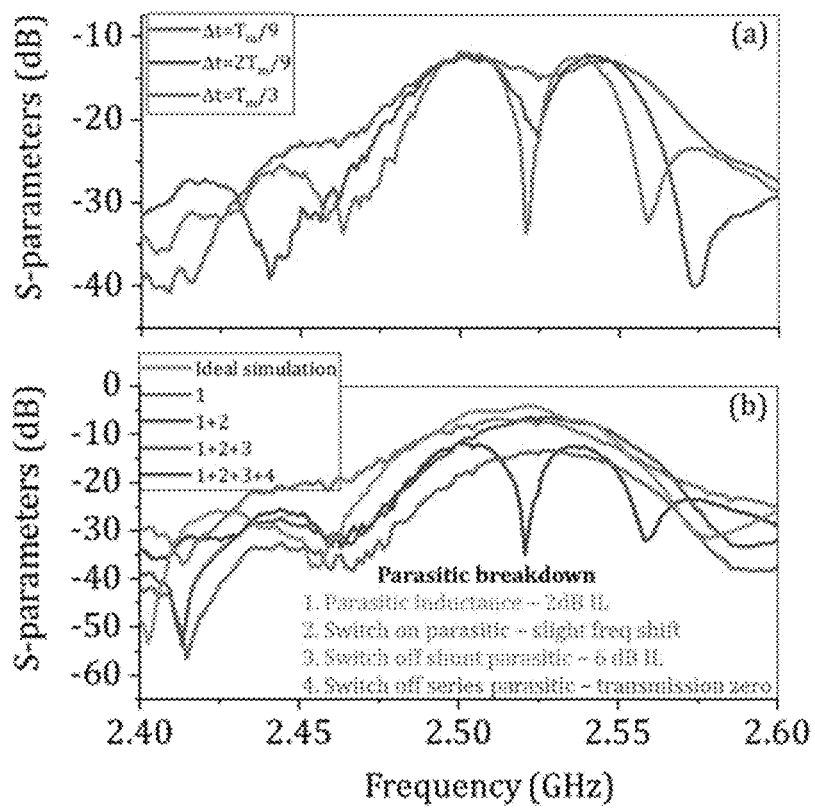
FIG. 18(a)
FIG. 18(b)
FIG. 18

MICROELECTROMECHANICAL TUNABLE DELAY LINE CIRCUIT

CROSS REFERENCE TO RELATED APPLICATIONS

This application claims benefit under 35 U.S.C. § 119(e) of U.S. Provisional Application No. 63/074,724, filed on 4 Sep. 2020 and entitled "Microelectromechanical Tunable Delay Line Circuit", which is hereby incorporated by reference.

STATEMENT REGARDING FEDERALLY SPONSORED RESEARCH OR DEVELOPMENT

This invention was made with government support under Grant Number HR0011-17-2-0002 awarded by DARPA. The government has certain rights in the invention.

BACKGROUND

Delay lines are essential devices that delay the input signal to the output with minimal loss, being widely used in applications including RF communication, sensing, timing, signal processing and so on. Conventionally, the signal delay is achieved by using linear time invariant (LTI) devices such as transmission lines or acoustic delay lines, providing fixed delay without tunability. Therefore, in the scenarios when arbitrary group delay is required, complicated solutions are inevitable. For instance, one of the major applications of the delay lines is in full-duplex radios, where self-interference from the transmitter is cancelled at the receiver by subtracting the received signal with the same power level and delay. However, because the self-interference is constantly changing due to environmental change, the required group delay is also time varying. Conventionally, the arbitrary group delay is synthesized through time-varying combination of multiple fixed delay lines, thus are bulky in dimensions and limited in accuracy. In such situations, delay lines with tunable group delay are valuable.

Recently, with the advancement of linear periodic time varying (LPTV) circuit, several solutions have been proposed to address challenges that have long puzzled the RF community. Compared to passive circuits, the technique of LPTV circuits enables properties that have been considered extremely difficult, if not impossible, such as non-reciprocity, tunability and the breaking of physical limits. One application of these advancements is a proposed tunable delay line based on the sequential switching of shunt capacitors in an N-path configuration. In this proposed configuration, shunt capacitors are connected to the input and output port by sets of input and output switches, so that the input voltage swing can be sampled by the shunt capacitors and then restored at the output. The group delay tunability is achieved by tuning the time delay between the input switches and the output switches to change the time during which the charge is stored in the capacitors. However, at high input frequency, such a technique requires high sampling frequency to avoid frequency aliasing. Therefore the available group delay and its tuning range (TR) are limited. Such a fundamental trade-off limits the potential application of such a tunable delay line.

SUMMARY

In this technology, a microelectromechanical tunable delay line (MTDL) based on spatiotemporal modulation of high-Q MEMS resonators is proposed. The proposed delay line circuit shows tunable group delay with orders of magnitude larger group delay amount and tuning range (TR) compared to previous demonstration. Such a performance is achieved thanks to the use of high-Q MEMS resonators. Compared to the previous demonstrations based on capacitors, the use of MEMS resonators improves the circuit by working around the resonance. The resonance preserves the RF oscillation directly instead of sampling the input signal, therefore lower modulation frequency is possible without frequency aliasing. Ultra-low modulation frequency is enabled by the high-Q of the MEMS resonators and hundreds of times larger group delay and TR can thus be achieved. Furthermore, a bandwidth broadening technique based on the coupling of multiple resonators is proposed to mitigate the narrowband nature of the high-Q system, boosting the bandwidth by several times, yielding a BW*Q of 14 with very little modulation effort (0.8% of RF frequency).

In one aspect of the invention, a tunable delay circuit device is provided. The tunable delay circuit device includes an input port. The tunable delay circuit device also includes an output port. The tunable delay circuit device also includes at least three parallel paths connecting the input port and the output port. Each path includes an input switch and an output switch. Each path also includes a plurality of shunt resonant tanks connected between the input switch and the output switch. Each shunt resonant tank periodically chargeable from the input port and dischargeable to the output port by operation of the input switch and the output switch.

In some embodiments the shunt resonant tank comprises a periodically modulated microelectromechanical (MEMS) resonator or an LC tank. In some embodiments the input switches and the output switches on each path are periodically modulated with a duty cycle to cover an entire modulation period. In some embodiments each of the plurality of shunt resonant tanks having a different center frequency. In some embodiments the different center frequencies of the plurality of shunt resonant tanks are equally spaced with respect to each other by three times a modulation frequency of the device. In some embodiments the device also includes a first matching inductor connected between the input port and the at least three parallel paths. In some embodiments the device also includes a second matching inductor connected between the output port and the at least three parallel paths. In some embodiments each path includes seven shunt resonant tanks. In some embodiments the modulation frequency is 20 MHz. In some embodiments the device also includes circuitry in communication with the input and output switches to operate each of the input and output switches at a selected modulation period and a selected duty cycle. In some embodiments the modulation period is comparable to a time constant of the shunt resonant tanks. In some embodiments the duty cycle is selected based on a number of the shunt resonant tanks. In some embodiments each shunt resonant tank includes an electromechanical resonator or a resonant circuit. In some embodiments the resonant circuit includes a capacitor bank, back to back varactors, or reconfigurable resonators. In some embodiments each of the shunt resonant tanks includes a thin-film piezoelectric resonator. In some embodiments each shunt resonant tank comprises a piezoelectric layer, a first conductive material layer comprising at least a first electrode on a top surface of the piezoelectric layer, and a second conductive material layer comprising at least a second electrode on a bottom surface of the layer. In some embodiments wherein the piezoelectric layer is a piezoelectric material selected from the group consisting of quartz, aluminum nitride, doped aluminum nitride, lithium niobate, lithium tantalite, zinc oxide, and gallium nitride. In some embodiments each input switch and output switch comprises a single pole single throw switch or a single pole double throw switch.

In another aspect of the invention a method of operating a tunable delay circuit device is provided. The method includes providing the tunable delay circuit device. The device includes an input port. The device also includes an output port. The device also includes at least three parallel paths connecting the input port and the output port. The device also includes on each path, an input switch and an output switch. The device also includes on each path, a plurality of shunt resonant tanks connected between the input switch and the output switch. The method also includes operating the input and output switches to periodically charge each shunt resonant tank from the input port. The method also includes operating the input and output switches to periodically discharge each shunt resonant tank to the output port.

In some embodiments, the method includes introducing three low-loss poles into the device for each of the plurality of shunt resonant tanks.

Additional features and aspects of the technology include the following:

1. A tunable delay circuit device comprising:
an input port;
an output port;
at least three parallel paths connecting the input port and the output port;
on each path, an input switch and an output switch; and
on each path, a plurality of shunt resonant tanks connected between the input switch and the output switch, each shunt resonant tank periodically chargeable from the input port and dischargeable to the output port by operation of the input switch and the output switch.

2. The device of 1, wherein the shunt resonant tank comprises a periodically modulated microelectromechanical (MEMS) resonator or an LC tank.

3. The device of any of 1-2, wherein the input switches and the output switches on each path are periodically modulated with a duty cycle to cover an entire modulation period.

4. The device of any of 1-3, wherein each of the plurality of shunt resonant tanks having a different center frequency.

5. The device of any of 1-4, wherein the different center frequencies of the plurality of shunt resonant tanks are equally spaced with respect to each other by three times a modulation frequency of the device.

6. The device of any of 1-5, further comprising:
a first matching inductor connected between the input port and the at least three parallel paths; and
a second matching inductor connected between the output port and the at least three parallel paths.

7. The device of any of any of 1-6, wherein each path includes seven shunt resonant tanks.

8. The device of any of 1-7, wherein the modulation frequency is 20 MHz.

9. The device of any of 1-8 further comprising circuitry in communication with the input and output switches to operate each of the input and output switches at a selected modulation period and a selected duty cycle.

10. The device of any of 1-9, wherein the modulation period is comparable to a time constant of the shunt resonant tanks.

11. The device of any of 1-10, wherein the duty cycle is selected based on a number of the shunt resonant tanks.

12. The device of any of 1-11, wherein each shunt resonant tank includes an electromechanical resonator or a resonant circuit.

13. The device of any of 1-12, wherein the resonant circuit includes a capacitor bank, back to back varactors, or reconfigurable resonators.

14. The device of any of 1-13, wherein each of the shunt resonant tanks includes a thin-film piezoelectric resonator.

15. The device of any of 1-14, wherein each shunt resonant tank comprises a piezoelectric layer, a first conductive material layer comprising at least a first electrode on a top surface of the piezoelectric layer, and a second conductive material layer comprising at least a second electrode on a bottom surface of the layer.

16. The device of any of 1-15, wherein the piezoelectric layer is a piezoelectric material selected from the group consisting of quartz, aluminum nitride, doped aluminum nitride, lithium niobate, lithium tantalite, zinc oxide, and gallium nitride.

17. The device of any of 1-16, wherein each input switch and output switch comprises a single pole single throw switch or a single pole double throw switch.

18. A method of operating a tunable delay circuit device comprising,
providing the tunable delay circuit device including:
an input port;
an output port;
at least three parallel paths connecting the input port and the output port;
on each path, an input switch and an output switch; and
on each path, a plurality of shunt resonant tanks connected between the input switch and the output switch;
the method comprising:
operating the input and output switches to periodically charge each shunt resonant tank from the input port; and
operating the input and output switches to periodically discharge each shunt resonant tank to the output port.

19. The method of 18, further comprising introducing three low-loss poles into the device for each of the plurality of shunt resonant tanks.

DESCRIPTION OF THE DRAWINGS

FIG. 5 illustrates the simulated transient output voltage and the voltage across one LC tank of the switched resonant tank delay line. The tanks restore the voltage oscillation directly at the output without sampling efforts, therefore allowing significantly lower modulation frequencies.

FIG. 6(a) illustrates the simulated S-parameters of the switched resonant tank delay line with different $Q_u$ and modulation frequency. FIG. 6(b) illustrates the simulated group delay of the switched resonant tank delay line with different $Q_u$ and modulation frequency.

FIG. 8 illustrates the simulated transient motional current and static current of one path of the MTDL. During the delay time Δt when both switches are off, the current oscillates between the motional branch and the static branch, therefore restoring the current oscillation directly at the output when output switches are turned on.

FIG. 9 illustrates the simulated S-parameters and group delay of the MTDL. The transmission response exhibits multiple poles spaced at $F_m$, originated from the spatiotemporal modulation. These poles are coupled together forming a bandpass structure.

FIG. 10(a) illustrates the simulated S-parameters and group delay of the MTDL while increasing its $Q_L$ to the upper limit of 333, by decreasing the $C_0$. FIG. 10(b) illustrates the simulated S-parameters and group delay of the MTDL while increasing its $Q_L$ to the upper limit of 333, by decreasing the $kt^2$.

FIG. 11 illustrates the circuit schematic of the bandwidth broadening technique. Multiple resonators with different center frequencies are connected in parallel at each path.

FIGS. 12(a) and 12(b) illustrates the simulated S-parameters and group delay of the MTDL with one and three resonators per path. The response with three resonators exhibits multiple poles for each resonance that are all coupled together, therefore showing wider bandwidth.

FIG. 13(a) illustrates the variation of the bandwidth with different modulation frequencies and numbers of resonators. FIG. 13(b) illustrates the variation of the insertion loss with different modulation frequencies and numbers of resonators. FIG. 13(c) illustrates the variation of the group delay ripple with different modulation frequencies and numbers of resonators. FIG. 13(d) illustrates the variation of the insertion loss ripple with different modulation frequencies and numbers of resonators.

FIG. 14(a) illustrates the simulated transmission of the MTDL with 7 resonators per path and a modulation frequency of 20 MHz. FIG. 14(b) illustrates the simulated group delay of the MTDL with 7 resonators per path and a modulation frequency of 20 MHz.

FIG. 17 illustrates the complete circuit model of one path including the parasitics from the PCB and the switches.

FIG. 18(a) illustrates the simulated transmission considering all the parasitics including (1) PCB vias and wire bonds inductance, (2) switch on-state parasitics, (3) switch off-state shunt parasitics and (4) switch off-state series capacitance. FIG. 18(b) illustrates the simulated results by adding these parasitics sequentially.

DETAILED DESCRIPTION

Figures 1B, 1C:
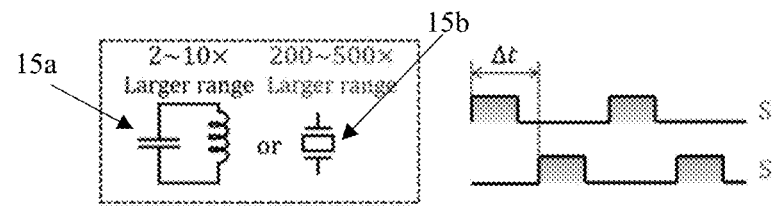
FIGS. 1($a$), 1($b$), and 1($c$) illustrate (a) a circuit schematic of the MTDL, (b) shunt resonant tank elements, and (c) control signals of the input switch $S_1$ and output switch $S_{1'}$. All other input and output switches have similar control signals with phase delays that cover the entire modulation period.

Delay lines are essential electrical elements that transmit the input signal to the output with certain delay. It is widely applied in the fields of signal processing, timing, sensing, RF communication and so on. Conventional delay lines only provide fixed amount of delay. In scenarios when arbitrary delay is required, the fixed delay line results in very bulky and complicated solution. Therefore, efforts have been taken to enable the tunability of the delay. In the previous solution, periodically modulated capacitors are used to sample the input signal at the output with controllable delay, exhibiting small group delay amount and tuning range, limited by Nyquist-Shannon sampling theorem. In order to improve the available delay and tuning range, the technology described herein provides a solution based on periodically modulated MEMS resonators. Through the invented circuit architecture, the input signal can be restored at the output directly through the high-Q resonances, thus does not require any sampling process, avoiding the restrictions posed by Nyquist-Shannon sampling theorem. With this technology, hundreds of times larger delay and tuning range can be achieved.

The circuit architecture has N paths (N>2) connecting the input and the output with sets of input switches and output switches. Both the input and the output switches are periodically modulated with (1/N) duty cycle, covering the entire modulation period (Tm). The time delay between the falling edges of the input switches and the rising edges of the output switches is Δt.

At the center node of each path, one or multiple shunt MEMS resonators are connected. The resonators are charged by the input and discharge to the output periodically, depending on the on/off status of the switches. When both switches are off, the voltage rings inside the tanks, contributing to the group delay of the system. Therefore, the group delay of the circuit can be tuned by changing Δt. In order to avoid the direct connection between the input and the output port, Δt should be in the range of 0 to Tm/3. The modulation period of the system should be set to a value that is comparable to the time constant of the MEMS resonators loaded by the port load.

The technology can provide a variety of features. For example the circuit shows tunable delay by simply controlling the time delay between the input and output switches. The circuit shows hundreds of times larger delay amount and tuning range compared to other existing tunable delay line solutions. The bandwidth of the circuit can be broadened by connecting multiple resonators in parallel, therefore breaking the bandwidth-Q trade-off and delay*bandwidth physical limit. The matching of the system can be controlled by the modulation. Therefore, smaller MEMS resonators (i.e., higher impedances) are allowed. For conventional MEMS-based RF systems, the MEMS resonators are typically required to be sufficiently large to be matched to 50 ohm. The system can use ultra low modulation frequency of 1% of RF frequency, >10 times smaller compared to other existing tunable delay line solutions.

The technology can provide a variety of advantages. For example, the technology can achieve 10-100 ns tunable delay and large tuning range, hundreds of times better than state of art. The technology can be advantageous in breaking the bandwidth-Q trade-off. The technology can be advantageous in broadening the bandwidth by >10 times compared to the amount determined by the Q value. The technology can be advantageous in breaking the physical limit of delay*bandwidth product. The product is typically less than 1 for linear time invariant circuit, and is more than 14 for this technology. The self-interference cancellation of wireless radios can be enabled by this technology, by simply tuning the delay of the delay line to the required amount. Multiple bulky fixed delay lines and complicated algorithm to linearly combine them are therefore no long needed. Other scenarios that require arbitrary delay can be enabled by this technology.

The tunable delay line can replace the multiple bulky fixed delay lines that are currently used in demonstrations for the self-interference cancellation of the RF front end with significantly less device size and system complexity. The low modulation frequency enabled by the high Q MEMS resonators guarantees ultra-low power consumption, therefore making the system more cost-effective. The technology can enable tunable delay. Compared to other existing technology, this technology can guarantee hundreds of times larger delay and tuning range. The technology can break the bandwidth-Q limits, showing at least 8 times wider bandwidth compared to the amount determined by the system Q. 4. The technology can achieve the bandwidth*Q product of more than 14, while for conventional delay line technologies they are less than 1. The technology can use more than 10 times smaller modulation frequency compared to existing technology.

The technology can be used in a variety of applications such as the delay elements for self-interference cancellation in wireless radios or used in radio frequency front ends; broad band RF filter with tunable delay for RF communications; and tunable high-Q feedback components for oscillators. The technology can be used in a variety of applications that employ tunable RF filters.

In order to expand the tunable range (TR) and, accordingly, the potential applications, the MTDL technology described herein uses resonant tanks instead of sampling the input signal. Unlike the capacitors of the prior art system, the resonant tanks are capable of restoring the oscillation of the input signal and thus are intrinsically aliasing-free. However, as will be described in greater detail below, the unloaded quality factor ($Q_u$) of the inductors restricts the loaded quality factor ($Q_L$) of the system and thus again places a lower bond on the modulation frequency. As a result, even though exhibiting several times larger group delay and its TR compared to switched capacitor delay line delay lines, the trade-off between TR and input frequency still exists. Therefore, in order to further break the trade-off, shunt high-$Q_u$ MEMS resonators are used. Due to a much higher $Q_L$ enabled by the high $Q_u$, significantly larger group delay is achieved, with hundreds of times improvement of the TR. Furthermore, an innovative bandwidth-broadening technique is proposed to address the challenge of the narrow band nature of the high Q system. The bandwidth of the delay line is broadened by connecting multiple MEMS resonators at each path to introduce more poles to the system, achieving bandwidth of 400 MHz with almost flat group delay response. Such a performance is unprecedented for MEMS-based delay line. Finally, the proposed MTDL is experimentally demonstrated.

Circuit Schematic

Figure 1A:
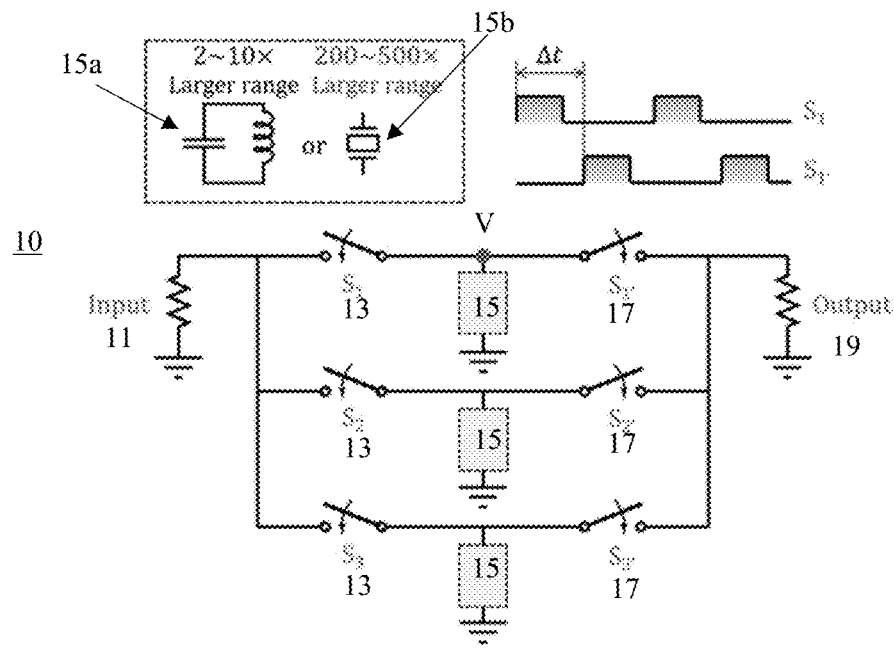

FIGS. 1(a)-1(c) illustrate a circuit architecture of the MTDL technology described herein. As shown, the circuit 10 has three paths connecting an input 11 and an output 19 with sets of input switches 13 ($S_1$, $S_2$ and $S_3$) and output switches 17 ($S_{1'}$, $S_{2'}$ and $S_{3'}$). However, it will be apparent in view of this disclosure that any suitable number of paths can be used in accordance with various embodiments or as required by various applications. For example, more paths can be implemented to get higher delay and TR.

Still referring to FIGS. 1(a)-1(c), both the input switches 13 ($S_1$, $S_2$ and $S_3$) and output switches 17 ($S_{1'}$, $S_{2'}$ and $S_{3'}$) can periodically modulated with 33% duty cycle, covering the entire modulation period $T_m$. As will be apparent in view of this disclosure, additional paths will general lead to a reduced duty cycle (e.g., 25% for four paths, 20% for five paths). The time delay between the falling edges of the input switches and the rising edges of the output switches is $\Delta t$. At the center node of each path, a shunt resonant tank 15 (RT) is connected. The resonant tanks can be either LC tanks 15a (LC), or MEMS resonators 15b (MR), both of which are discussed in the following sections. The resonant tanks 15 (RT) are charged by the input and discharged to the output periodically, depending on the on/off status of the switches. When both switches are off, the voltage rings inside the tanks, contributing to the group delay of the system. Therefore, the group delay of the circuit can be tuned by changing $\Delta t$. In order to avoid the direct connection between the input and the output port, $\Delta t$ should be in the range of 0 to $T_m/3$.

Figure 2:
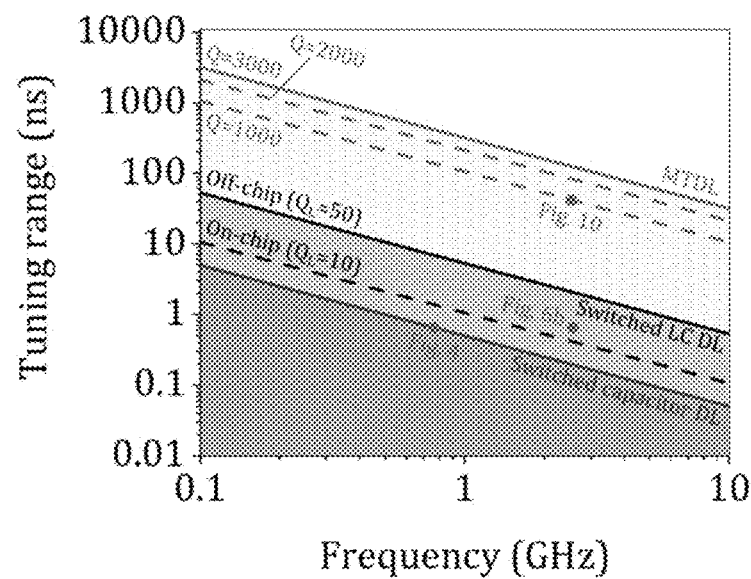
FIG. 2 illustrates the relationship of the input frequency and the group delay TR of the tunable delay line based on the use of shunt capacitors, LC tanks and MEMS resonators.

The most important metrics of tunable delay line are the group delay and the TR. With smaller modulation frequency, both the group delay and the TR can be increased. Since the group delay usually has dispersion which complicates the comparison, the TR is chosen as the benchmark for comparison in this paper. As will be briefly discussed in section B, switched capacitor delay line is limited in the group delay and the TR, due to frequency aliasing. On the other hand, as will be shown in section C, the use of resonant tanks changes the working principle of the circuit completely. The resonant tanks restore the voltage oscillation of the input signal at the output directly, therefore eliminating the aliasing problem. As a result, compared to shunt capacitors, the use of shunt LC tanks improves the TR by 2 to 10 times (FIG. 2), limited by the available $Q_u$ of the inductors. MEMS resonators, being miniaturized acoustic devices with $Q_u$ of more than 1000, are perfect candidates for this circuit configuration. As will be discussed in detail in section D, thanks to the much higher $Q_u$ of the MEMS resonators, the TR can be improved by 200 to 500 times (FIG. 2).

Limitations of Switched Capacitor Delay Lines

Figure 3:
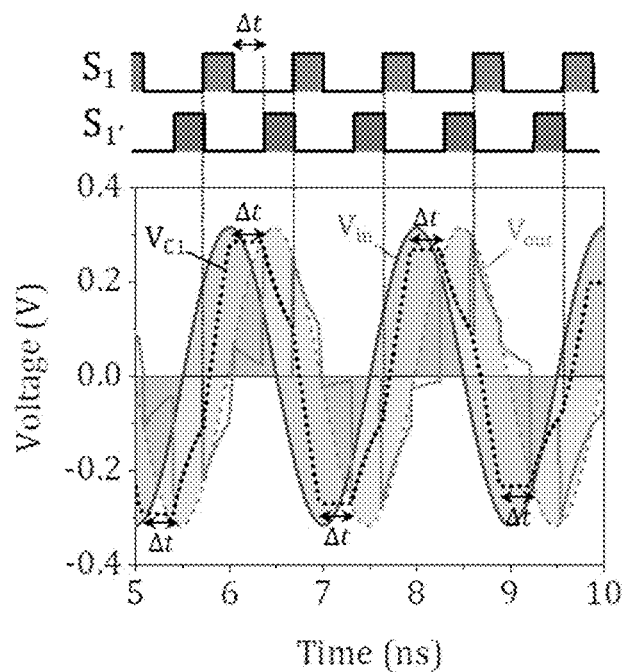
FIG. 3 illustrates the simulated transient input voltage, output voltage and the voltage across one shunt capacitor of the switched capacitor delay line. The shunt capacitors sample the input voltage and restore it at the output with a controllable delay $\Delta t$. Due to the discharging profile of the output voltage, part of the output energy is transferred from the fundamental tone to the intermodulation products, therefore causing slight insertion loss.

Switched capacitor delay lines are briefly discussed here to evaluate the trade-off between the TR and the frequency. For example, FIG. 3 shows a transient simulation of input voltage, output voltage and voltage across one capacitor. The circuit used to produce the data illustrated in FIG. 3 was a three path circuit wherein each path included an input switch ($IS_1$), an output switch ($OS_1$), and a capacitor connected at a center node. The capacitors were 6.37 pF, corresponding to a time constant $\tau$ of 0.32 ns assuming a port impedance of 50 ohm. The modulation frequency $F_m$ and modulation period $T_m$ are set such that one charging or discharging period ($T_m/3$) is equal to the time constant, therefore $F_m$ is set to 1.05 GHz. The input signal is a single tone signal at 0 dBm with a frequency of 500 MHz. The delay $\Delta t$ is set to be $T_m/3$. As shown in the figure, during the period when $IS_1$ is turned on, $V_{C1}$ is charged almost to the instantaneous input voltage during that period. In other words, the shunt capacitor acts like a voltage sampler that samples the transient input voltage at every charging period. After $I_{S1}$ is turned off, the voltage is stored in the capacitor for $\Delta t$, and then $OS_1$ discharges to the output. Therefore, the sampled input voltage is transferred to the output with a delay of $\Delta t$. Since the output switches from the three paths cover the entire period, the transient output follows a repetitive discharging profile, the amplitude of which depends on the sampled input voltage. By changing the time difference $\Delta t$, the delay between the input and the output can be tuned. The discharging profile of the output voltage distorts the output waveform from a perfect sinusoid, creating harmonics in the frequency domain and therefore causing insertion loss (IL) of the fundamental tone.

Figure 4:
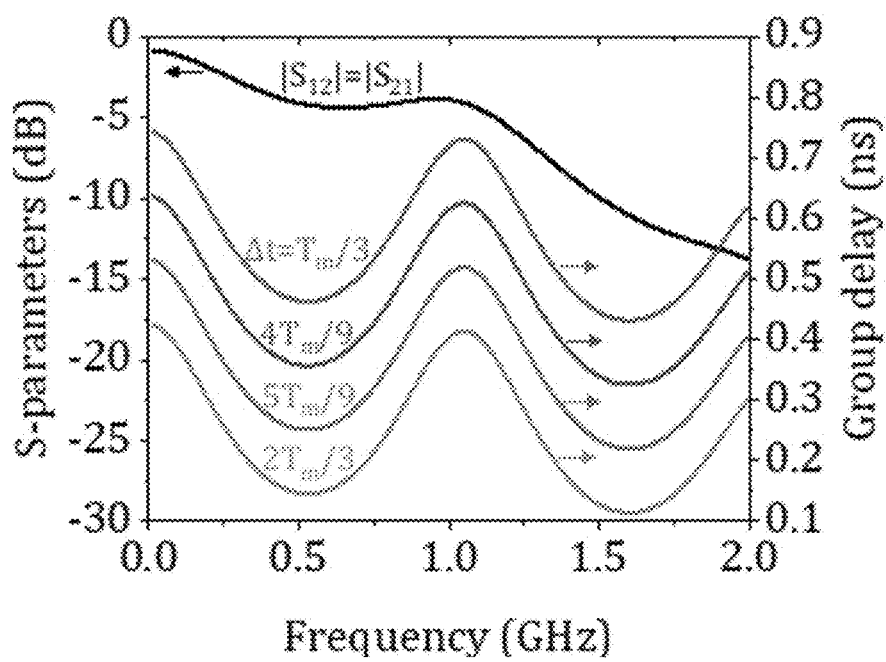
FIG. 4 illustrates the simulated S-parameters and group delay of the switched capacitor delay line. The averaging group delay is tunable from 0.28 ns to 0.6 ns, corresponding to a TR of 0.32 ns.

The simulated S-parameters and the group delay is plotted in FIG. 4. The tunable group delay is demonstrated by changing the Δt from 0 to $T_m/3$, showing an averaging group delay from 0.28 ns to 0.6 ns, corresponding to a TR of 0.32 ns. At around DC, the IL is 0.9 dB, coming from the transfer of the energy from the fundamental tone to the harmonics. The IL increases at higher input frequency, which is because of the frequency aliasing since the sampling rate of the input voltage is insufficient at large input frequency. According to Nyquist-Shannon sampling theorem, the maximum aliasing-free frequency is $$f_c = f_s/2, \quad (1)$$

where $f_c$ is the critical frequency above which frequency aliasing happens, $f_s$ is the sampling frequency and is equal to $3f_m$ in the case of three paths. As mentioned above, the maximum TR of the group delay is $T_m/3$, therefore, the relationship between the TR and the aliasing-free input frequency can be established, $$TR = \frac{1}{2f_c}. \quad (2)$$

The TR versus aliasing-free input frequency is plotted in FIG. 2. A trade-off between the critical input frequency and the group delay TR can be clearly observed, setting an upper limit for the available delay. For example, the TR versus critical frequency of the results in FIG. 4 is labeled in FIG. 2, located on the blue line. Therefore, since capacitors store the input voltage swing in DC, at high input frequency, the input signal cannot be faithfully reproduced at the output, unless sampling at high enough rate. However, this high modulation frequency limits the range of Δt, therefore limiting the TR of the group delay, as well as the maximum delay it can achieve.

Switched Resonant Tank Delay Lines

Resonant tanks, preserving the voltage oscillation through resonance, can potentially avoid this sampling issue and push the group delay and its TR higher. At higher frequency, as long as the frequency matches the resonant frequency of the tanks, the tanks store the oscillation directly through their resonances. Therefore, the modulation frequency is decoupled from the RF frequency and lower modulation frequency is possible, leading to higher group delay and TR. Since a current loop is required when both switches are off to preserve the oscillation, parallel LC tanks are preferred in this configuration. For series tanks, as soon as both switches are off, the oscillation stops due to the lack of current loop.

The delay line based on the parallel LC tanks is simulated in ADS transient simulation. The tanks have a $Q_L$ of 5, where the $Q_L$ is calculated by $$Q_L = \frac{Z_0}{\omega_0 L}, \quad (3)$$

where $Z_0$ is the port impedance. The resonant frequency of the LC tanks is 2.5 GHz, corresponding to a capacitance of 6.37 pF, an inductance of 0.64 nH and a loaded time constant $\tau_L$ of 0.64 ns.

The $\tau_L$ is defined as $$\tau_L = \frac{2Q_L}{\omega_0}. \quad (4)$$

The input signal is a single tone signal at 0 dBm with a frequency of 2.5 GHz. The modulation frequency is 520 MHz, so that each charging or discharging period ($T_m/3$) is equal to the $\tau_L$ of the tanks, i.e., $T_m/3 = \tau_L$. The delay time Δt is set to be $T_m/3$. The transient voltage across one LC tank $V_{C1}$ and the output voltage $V_{out}$ are plotted in FIG. 5. When $S_1$ is closed (the purple area), the LC tank is connected to the input signal, therefore the voltage $V_{C1}$ rings up. After $S_1$ is open (the white area), the voltage across the LC tank still oscillates due to the self-resonance, and then rings down through the discharging process to the output when $S_{1'}$ is closed (the green area). As a result, the oscillation of the input signal is restored without the requirement of a high sampling rate. Therefore, fundamentally different from switched capacitor delay line, the modulation frequency is not limited by the RF frequency anymore, and can be reduced to achieve higher delay and TR. However, as will be shown next, they are still limited by the $Q_u$ of the resonant tanks.

When both switches are off (the white area), the voltage oscillation dissipates it energy according to the $Q_u$ of the tanks. For LC tanks, the $Q_u$ is mostly determined by the inductors. Assuming $Q_{ind} \gg 1$, where $Q_{ind}$ is the quality factor of the inductor, $Q_u = Q_{ind}$. If $Q_u$ is not negligible, additional IL is expected, increasing with the delay time Δt. FIGS. 6(a) and 6(b) show the simulated S-parameters of the switched resonant tank delay line, with different $Q_u$ and modulation frequencies. As expected, at the modulation frequency of 520 MHz, i.e., $T_m/3 = \tau_L$ as mentioned above, when $Q_u$ is high enough (i.e., $Q_u = 1000$), the transmission in both directions are the same. However, when $Q_u$ is not sufficiently large (i.e., $Q_u = 15$), the transmission from port 1 to port 2 suffers from additional loss compared to that from port 2 to port 1. This additional loss is due to the energy dissipation during the delay time when the signal transmits from port 1 to port 2. On contrary, when the signal transmits from port 2 to port 1, since $S_{1'}$, $S_{2'}$ and $S_{3'}$ becomes the input switches, the signal built on the tanks discharges to the output directly without any delay, thus showing less loss. Therefore, this IL difference between the $|S_{12}|$ and $|S_{21}|$ also represents the IL variation when Δt is tuned from 0 to $T_m/3$. In practice, preferably, the IL of a tunable delay should keep constant during group delay tuning. Hence, this IL variation must be minimized.

The IL variation ΔIL, defined as the IL variation when Δt is tuned from 0 to Δt, can be calculated based on the attenuation of the voltage amplitude during the delay, $$\Delta IL = e^{-\Delta t/\tau_u}, \quad (5)$$

where the delay time Δt is set according to the loaded time constant $\tau_L$, and $\tau_u$ is the unloaded time constant of the LC tanks defined as $$\tau_u = \frac{2Q_u}{\omega_0}. \quad (6)$$

Substituting (4) and (6) into (5), $$\Delta IL = e^{-Q_L/Q_u}.$$

According to (7), to make sure minimal IL variation, for example, ΔIL<3 dB, the ratio of the $Q_L$ and $Q_u$ should satisfy $$\frac{Q_u}{Q_L} > 3. \tag{8}$$

For example, in FIG. 6(a), the circuit based on LC tanks with $Q_L$ of 5 and $Q_u$ of 15 exhibits a 3 dB difference between the $S_{12}$ and $S_{21}$ ($|S_{12}|$=4 dB, $|S_{21}|$=7 dB), consistent with (8).

Eq. (8) sets an upper limit for the available $Q_L$, depending on the available $Q_u$, beyond which the delay line exhibits large IL variation. The $Q_L$ then limits the available modulation frequency and therefore the group delay and its TR. It could be argued that the modulation period is not necessarily equal to $3\tau_L$, and can be slightly tuned up to improve the group delay TR. This is true to some extent, but further decrease of the modulation frequency increases the both the IL and ΔIL significantly. The former is because when the charging and discharging period becomes too large, the charging and discharging efficiency degrades due to the arrival of steady state of the resonant tanks. The latter is due to the increase of the delay time, which dissipates more energy through $Q_u$. As an example, FIG. 6(a) also plots the simulated S-parameters with two times smaller modulation frequency (260 MHz, thus $T_m/3=2\tau_L$). Evidently, the overall IL is higher, and the ΔIL increases to 6.9 dB ($|S_{21}|$=12.5 dB; $|S_{12}|$=6.6 dB). Therefore, the modulation frequency cannot be reduced significantly without increasing the time constant of the resonant tanks simultaneously. For this reason, for the calculation of the TR limit in this paper, the modulation frequency is always assumed to satisfy $T_m/3=\tau_L$, as mentioned above. In this case, the group delay TR is equal to the loaded time constant of the resonant tanks. Substituting the $\tau_L$ with the TR in (4), $$TR = \frac{Q_L}{\pi F_0}. \tag{9}$$

For on-chip inductors, the available $Q_u$ is less than 10, whereas for off-chip ones, the available $Q_u$ is higher, possibly above 50. FIG. 2 plots the relationship between the resonant frequency and the TR based on (8) and (9), assuming a $Q_u$ of 10 and 50 respectively. The simulated results in FIG. 6(b) with $Q_u$ of 15 is also labeled, located between the $Q_u$ of 10 and 50. The TR is improved by 2 to 10 times compared to the switched capacitor delay line. However, due to the limited $Q_u$ of the inductors, further improvement is still limited.

MTDL

MEMS resonators are micro-acoustic devices that move the resonance from electrical domain to mechanical domain using piezoelectricity, therefore showing significantly lower dissipation and higher $Q_u$. For example, AlN based MEMS resonators have been demonstrated with $Q_u$ of several thousand. Therefore, potentially, MEMS resonators can also be modulated as resonant tanks, yielding much higher delay and TR. Based on (4) and (8) the relationship between the TR and the input frequency based on MEMS resonators is also plotted in FIG. 2, with a $Q_u$ of 1000, 2000 and 3000. The TR is improved by orders of magnitude.

A variety of suitable MEMS resonators can be used, such as, without limitation, a bulk acoustic wave resonator, film bulk acoustic resonator, surface wave acoustic resonator, contour mode resonator, cross-sectional-Lamé-mode resonator (CLMR), two-dimensional-mode-resonator (2DMR), combined overtone resonator, and a quartz crystal resonator.

In some embodiments, nanoelectromechanical resonators can be used. Some suitable MEMS resonators are described in U.S. Pat. No. 9,935,608 and US 2018/0287047, both of which are incorporated by reference herein.

Figure 7:
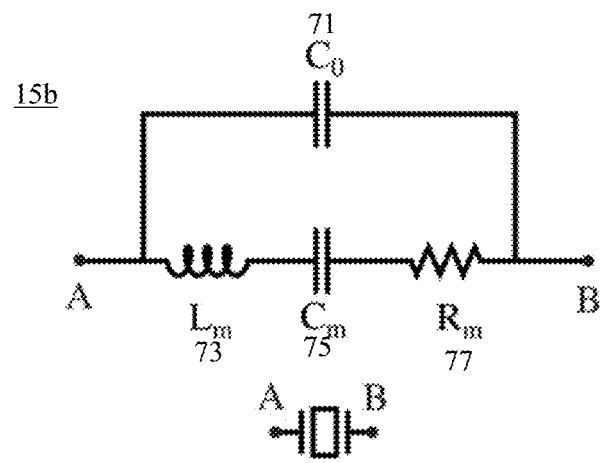
FIG. 7 illustrates the equivalent circuit model of a MEMS resonator.
Figure 8:
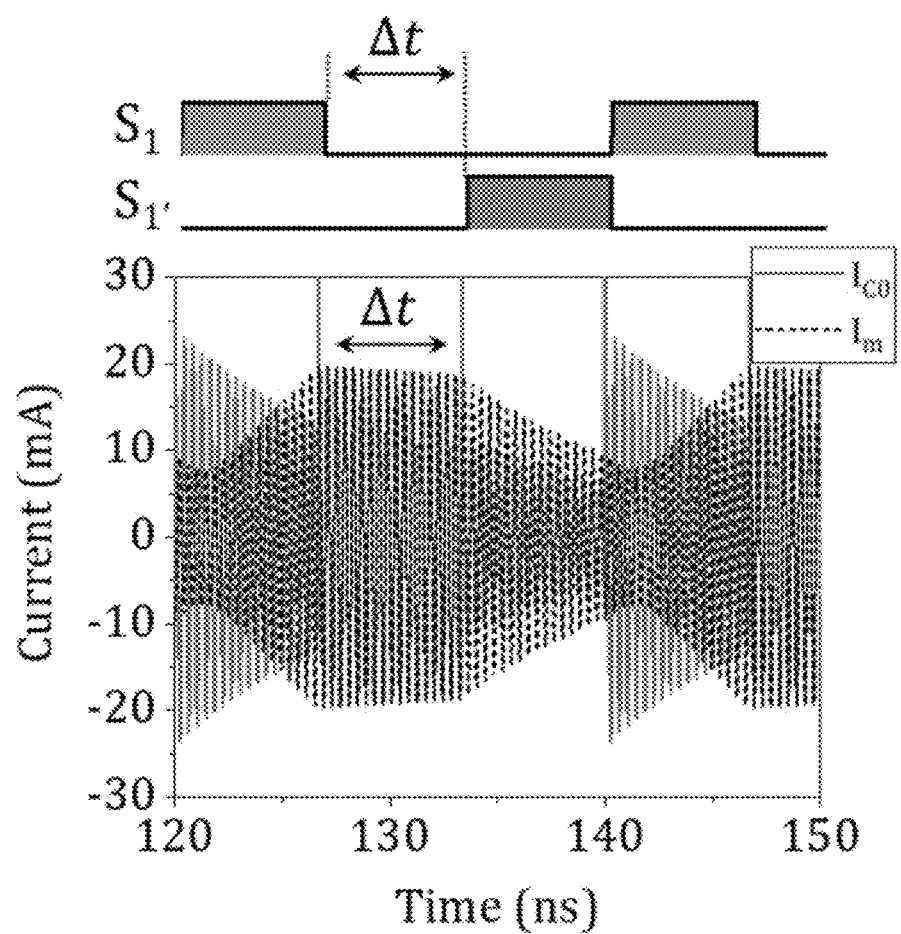

The equivalent circuit of a MEMS resonator 15b is shown in FIG. 7. $C_0$ 71 is the static capacitance between the electrodes. $L_m$ 73, $C_m$ 75, and $R_m$ 77 are motional inductance, motional capacitance and motional resistance, together forming the motional branch that represents the mechanical resonance. The $L_m$, $C_m$ and $R_m$ can be calculated as $$R_m = \frac{\pi^2}{8} \frac{1}{\omega_0 C_0 kt^2 Q_u}, \tag{10}$$

$$C_m = \frac{\pi^2}{8} C_0 kt^2, \tag{11}$$

$$L_m = \frac{\pi^2}{8} \frac{1}{\omega_0^2 C_0 kt^2}, \tag{12}$$

where $\omega_0$ is the radius resonant frequency, and $kt^2$ is the electromechanical coupling factor.

The delay line based on MEMS resonators is simulated using ADS transient simulator, assuming a center frequency of 2.5 GHz, $kt^2$ of 3% and Q of 1000. The modulation frequency is 50 MHz. The transient current that flows into the motional branch $I_m$ and the static branch $I_{C0}$ are plotted in Fig, with a single tone input signal of 2.5 GHz at 0 dBm. When $S_1$ is closed, the motional current amplitude is charged by the input current. After $S_1$ is open, the current rings inside the resonator. Therefore, the current amplitude of $I_m$ and $I_{C0}$ are equal to each other during this time period. In other words, due to the current loop formed by the motional branch and the static branch, the current is preserved in the resonator even without any load, similar to the case of the parallel LC tanks, thus contributing to the delay of the signal. After $S_1$, is closed, the motional current discharges to the output port.

The simulated S-parameters and the group delay are plotted in Fig. FIG. 9. The transmission shows multiple poles separated by $F_m$, originated from the higher order mixing products from the switches. Moving further away from the center pole, the loss increases due to less energy at the higher mixing products. The group delay is tunable from 7.2 ns to 13.9 ns, exhibiting a TR of 6.4 ns, 10 times higher compared to FIGS. 6(a) and 6(b). Noticeable group delay ripples exist at a similar level as FIGS. 6(a) and 6(b), at the frequencies of the poles, due to the transmission phase fluctuation at these frequencies. Since both the fluctuation in the IL and the group delay are related to the coupling of the poles, they can be flattened by reducing the modulation frequency, thus reducing the distance between them and enhancing the coupling. This is demonstrated in the next section in details.

In order to increase the delay and its TR for the MTDL, a larger $Q_L$ should be chosen. Substituting (12) into (3), the $Q_L$ of a MEMS resonator can be represented as $$Q_L = \frac{\pi^2}{8\omega_0 Z_0 C_0 kt^2}. \tag{13}$$

Therefore, in order to increase the $Q_L$, either $C_0$ or $kt^2$ need to be decreased. Even though decreasing $C_0$ is more convenient, since $C_0$ can be decreased by simply shrinking the size of the resonators while $kt^2$ is determined by the piezoelectric coefficient, both of these two methods are simulated. According to (8), for a resonator with a $Q_u$ of 1000, the maximum $Q_L$ can be as high as 333. According to (3), assuming a center frequency of 2.5 GHz, this $Q_L$ corresponds to a $kt^2$ of 0.47% while keeping $C_0$ 1 pF, or a $C_0$ of 157 fF while keeping $kt^2$ 3%.

The S-parameters and the group delay of both cases are simulated, plotted in FIGS. 10(a) and 10(b). The modulation frequencies are both 7.8 MHz, so that $T_m/3 = \tau_L$. In both the two cases, the group delays show large TR of 42.7 ns. This TR versus the center frequency is labeled in FIG. 2, locating exactly at the line corresponding to a $Q_u$ of 1000, consistent with the analysis. In FIG. 10(a), the simulated magnitude of $S_{21}$ is 7.2 dB, while that of $S_{12}$ is 4.3 dB. In FIG. 10(b), the simulated magnitude of $S_{21}$ is 8 dB, while that of $S_{12}$ is 5 dB. Therefore, the IL variation caused by the energy dissipation through the motional resistance $R_m$ is around 3 dB, also consistent with (8). If the $Q_L$ is further increased, a larger TR can be achieved, however the IL variation will exceed 3 dB. In FIG. 10(b), the ripples in the group delay are larger compared to (a), this is attributed to the more significant loading effect of the $C_0$ with a smaller $kt^2$.

Bandwidth Broadening

While significantly improving the TR of the group delay, the bandwidth of the MTDL is relatively limited. Intrinsically, the narrow band nature is always a challenge for high-Q systems. For LTI systems, the bandwidth is physically determined by the Q of the system, therefore is usually very difficult, if possible, to increase. However, for LPTV circuit like MTDL, the transmission response is determined by the shunt resonators as well as the dynamic modulation, thus is possible to break the bandwidth-Q relationship by altering the dynamics. By connecting multiple resonators in parallel to each path in the MTDL circuit, more poles can be introduced to the system, so that the bandwidth can be broadened.

The circuit schematic of the bandwidth broadened MTDL 110 is shown in FIG. 11. At each path, multiple shunt resonant tanks 15 (MEMS resonators 15b as shown) with different center frequencies $f_1$, $f_2$ to $f_n$ are connected. As shown in FIG. 9, for each resonator, three low loss poles are introduced to the system, while higher-order poles have higher loss. Therefore, the center frequencies of the resonators 15 are $3F_m$ away, so that all the poles are equally spaced with respect to each other. Furthermore, when connecting resonators in parallel, the loading of the $C_0$ becomes un-negligible. Therefore, matching inductors 111, 113 are connected at each port to resonate out the $C_0$. To mitigate the dispersion of the transmission due to the imperfect resonating condition at further frequencies, the $C_0$ for different frequencies are scaled while keeping $$\frac{1}{\omega_0^2 C_0}$$

constant. Therefore, the matching inductors 111, 113 can be calculated as $$L_{matching} = \frac{n}{\omega_0^2 \sum C_{0n} \sum f_n}. \quad (14)$$

In other words, the inductors 111, 113 resonate out all the $C_0$ of the resonators at the averaging resonant frequency. As an example, the S-parameters and the group delay of 1 and 3 resonator(s) per path are simulated, plotted in FIGS. 12(a) and 12(b). The S-parameters with 3 resonators per path show equal spacing of all the 9 poles from the three resonances ($f_1$, $f_2$ and $f_3$), therefore exhibiting larger bandwidth. The bandwidth (defined by the distance between the left most peak and the right most peak, illustrated in FIGS. 12(a) and 12(b)) for the two cases are 400 MHz and 100 MHz respectively. The ILs (defined by the minimum IL inside the bandwidth) are 2.8 dB and 2.4 dB respectively. The IL ripples (defined by the difference of the maximum peak and the minimum valley inside the bandwidth) are 3.7 dB and 2.4 dB respectively. The group delay ripples (defined by the difference between the maximum and minimum group delay inside the bandwidth) are 6.8 ns and 4.6 ns, corresponding to fractional group delay ripples (defined by the ratio of the group delay ripple to the TR) of 102% and 69% respectively. Therefore, even though the bandwidth is broadened by connecting multiple resonators, the ripples in both the transmission and the group delay also increases. As mentioned above, the increase of the ripple is due to the loading of the static capacitance $C_0$. Even though the $C_0$ is resonated out by the matching inductors, perfect cancellation only occurs at a single frequency point, therefore the overall ripple over the entire bandwidth still increases. Since the ripples intrinsically come from the coupling of all the poles, as mentioned above, they can be flattened by arranging them closer to each other through decreasing the modulation frequency.

The fractional group delay ripple, IL ripple, IL and bandwidth with different numbers of resonators per path (n) and modulation frequencies are plotted in FIGS. 13(a)-13(d). For bandwidth, both the increase of n and $F_m$ broaden the bandwidth, as expected. For IL, in general, larger n and smaller $F_m$ increase the IL. When too many stages are used, the IL goes beyond 10 dB so the results are cut. The inverse relationship between the IL and the modulation frequency is explain previously. With a smaller modulation frequency, the resonators saturate during the charging and discharging process, therefore showing lower energy transfer efficiency. For the IL and group delay ripple, for modulation frequencies larger than 20 MHz, the group delay ripple increases with larger modulation frequencies and larger numbers of stages, consistent with the results in FIGS. 12(a) and 12(b). Below 20 MHz, further decreasing the modulation frequency might also increase the group delay ripple. Therefore, even though the bandwidth can be improved by connecting more resonators or using larger modulation frequencies, the maximum bandwidth is limited by the ripples in both transmission and group delay. Depending on the tolerance of the ripples for different applications, the maximum achievable bandwidth varies. The more robust the system is against the ripples, the larger bandwidth it can achieve.

When the modulation frequency is 20 MHz with 7 resonators per path, the group delay ripple shows a local minimum. The transmission and the group delay under this condition are plotted in FIGS. 14(a) and 14(b). The achieved bandwidth is 400 MHz, within which a large group delay of 33 ns is achieved. Such a high bandwidth exceeds far beyond the bandwidth defined by the $Q_L$ of the system, with minimal modulation effort that is 20 times smaller. At the same time, the ripples in the transmission and the group delay are almost negligible. Such a performance is unprecedented for any previously demonstrated fixed/tunable delay line, thanks to the innovative circuit architecture based on high-Q MEMS resonators and the novel bandwidth broadening technique.

Demonstration

Figure 15:
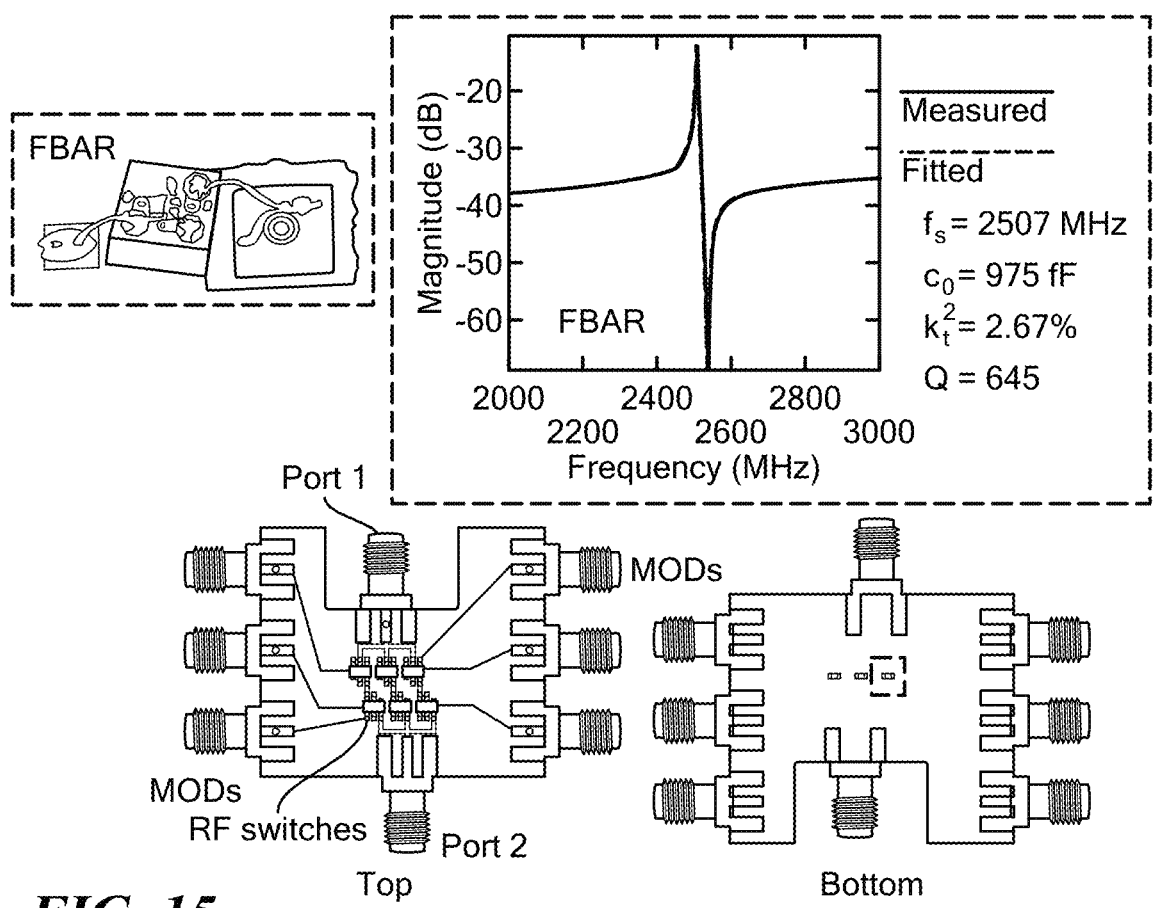
FIG. 15 illustrates the designed PCB for the demonstration of MTDL. Left inset: the connection of the FBAR to the PCB. Right inset: The BVD fitting of the FBAR, showing a center frequency of 2.5 GHz, $kt^2$ of 2.67% and Q of 645.

A printed circuit board (PCB) was designed and implemented to demonstrate the proposed circuit. As shown in FIG. 15, 6 single-pole double-throw (SPDT) RF switches (MASWSS0179) were connected on the top side of the PCB. These SPDT switches are used as single-pole single-throw (SPST) switches by leaving one RF output port open. The choice of the RF switches is based on two critical factors that, first, they must be reflective open when turned off (otherwise they will load the ports when turned off), and second, the switching speed must be significantly higher than modulation speed. The MEMS resonators are thin-film bulk acoustic resonators (FBARs) that are centered at 2.5 GHz with a $kt^2$ and Q of around 3% and 600 (right inset of FIG. 15). The MEMS resonators are attached to the bottom side of the PCB, connecting to the RF lines through wire bonds and PCB vias, to avoid possible damage to the chips during soldering process.

Figures 16A, 16B:
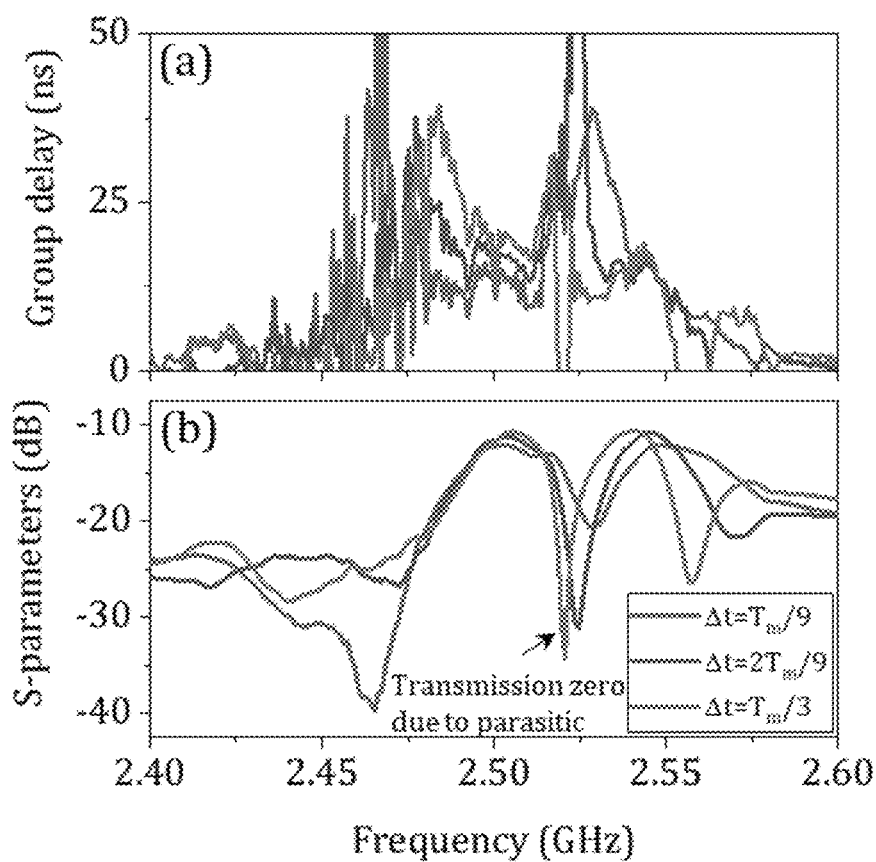
FIG. 16(a) illustrates the measured group delay of the PCB by tuning the Δt to be $T_m/9$, $2T_m/9$ and $T_m/3$.
FIG. 16(b) illustrates the measured S-parameters of the PCB by tuning the Δt to be $T_m/9$, $2T_m/9$ and $T_m/3$.

The S-parameters of the circuit are measured, shown in FIG. 16(b), by tuning the control signals with Δt of $T_m/9$, $2T_m/9$ and $T_m/3$ respectively. Instead of using $F_m$ of 50 MHz calculated by $$\frac{1}{3F_m} = \tau$$

as in previous simulations, the $F_m$ of 20 MHz are used to relief the requirement on the switching speed of the RF switches. The tunability of the group delay is demonstrated in FIG. 16(a), with the group delay tunable from 13 ns to 20 ns (at 2.5 GHz), showing a large tuning range of 7 ns. The transmission (FIG. 16(b)) shows a relatively high IL of 10.6-12.2 dB, as well as an additional transmission zero that is not predicted in the ideal circuit simulation, attributed to the parasitics from the PCB and the RF switches. This transmission zero is located in the passband, therefore limiting the available bandwidth of the circuit.

The fact that the parasitics from the implementation degrades the performance of the circuit is a common issue for time-varying circuits, especially the time-varying circuits based on MEMS resonators. Even though it is reasonable to claim that this performance degradation will be optimized through MEMS-CMOS integration, it is worthy to locate the sources of the parasitics and their effects on the performance, so that the improving strategy will be clearer. A circuit model with parasitics are established, as shown in FIG. 17, by considering two major sources of the parasitics including the switch parasitics and the parasitic inductance from the PCB vias and wire bonds connecting the FBARs and the RF lines. The switch parasitics are measured separately and are added to the simulation. It turned out that the off-state parasitics of the switches have significant impact on the circuit performance while the on-state parasitics do not. Therefore, the measured on-state parasitics are directly lumped into the simulation, while the off-state parasitics are fitted with a parasitic model and added into the simulation, as shown in the inset of FIG. 17. The off-state parasitic model includes an off-state series capacitance of 93 fF, shunt capacitance of 23 fF and shunt resistance of 730 ohm on each side. The parasitic inductance of the PCB vias and the wire bonds that are in series to the FBARs are estimated to be 4 nH in total. By considering all these parasitics in the circuit simulation, the simulated transmission is shown in FIG. 18(a), which is in good agreement with the measurement.

The effects of these four major parasitic sources (1. parasitic inductance from PCB vias and wire bonds, 2. Switch on-state parasitic 3. switch off-state shunt parasitic and 4. switch off-state series parasitic, as labeled in FIG. 17) are examined separately by adding to the simulation sequentially, illustrated in FIG. 18(b). The transmission when $\Delta t = 2T_m/3$ is plotted, which is the worst case in terms of loss and the bandwidth. The purple line is the ideal simulation, showing an insertion loss of around 4 dB, consistent with previous simulations. The parasitic inductance from the PCB vias and the wire bonds increases the loss by ~2 dB, without changing the shape of the passband (the green line). By adding the on-state parasitic of the RF switches, the performance of the circuit almost shows no degradation except for a slight frequency shift. Therefore, the largest impact comes from the off-state parasitics of the switches. By adding the off-state shunt parasitic to the simulation, the loss is drastically increased from 7 to 13 dB. This is reasonable because the shunt parasitic attenuates the self-resonating voltage amplitude during the delay time. Finally, by adding the off-state series capacitance to the system, a transmission zero is generated in the simulation, similar to the measured results. In summary, the relatively higher loss of the measured performance (12 dB) is attributed to the parasitic inductance (2 dB) and the off-state shunt parasitic of the RF switches (6 dB), and the additional transmission zero that limits the bandwidth is attributed to the off-state series capacitance of the switches. All these parasitics are significantly larger with COTS components and PCB implementation, and can be mitigated by integrating the RF switches and the MEMS resonators on chip level.

The technology described herein analyzes and demonstrates a tunable delay line circuit with large group delay and TR, based on the use of high-Q MEMS resonators. In order to develop a clear theoretical path from the conventional switched capacitor delay line to the MEMS-based MTDL, switched LC-resonant tank delay line is also proposed and analyzed. The analysis shows that thanks to the high-Q nature of the MEMS resonators, the MTDL shows orders of magnitude of improvement for both group delay and its TR. Furthermore, the bandwidth of the circuit is not limited by the high-Q MEMS resonators, thanks to the bandwidth broadening technique proposed in this paper. The proposed MTDL is successfully demonstrated using FBARs centered at 2.5 GHz, showing a large TR of 7 ns.

As used herein, "consisting essentially of" allows the inclusion of materials or steps that do not materially affect the basic and novel characteristics of the claim. Any recitation herein of the term "comprising," particularly in a description of components of a composition or in a description of elements of a device, can be exchanged with "consisting essentially of" or "consisting of."

The present technology has been described in conjunction with certain preferred embodiments and aspects. It is to be understood that the technology is not limited to the exact details of construction, operation, exact materials or embodiments or aspects shown and described, and that various modifications, substitution of equivalents, alterations to the compositions, and other changes to the embodiments and aspects disclosed herein will be apparent to one of skill in the art.

What is claimed is:

1. A tunable delay circuit device comprising:
an input port;
an output port;
at least three parallel paths connecting the input port and the output port;
on each path, an input switch and an output switch; and
on each path, a plurality of shunt resonant tanks connected between the input switch and the output switch, each shunt resonant tank periodically chargeable from the input port and dischargeable to the output port by operation of the input switch and the output switch;
wherein each of the shunt resonant tanks includes at least one of:
a thin-film piezoelectric resonator; or
a piezoelectric layer, a first conductive material layer comprising at least a first electrode on a top surface of the piezoelectric layer, and a second conductive material layer comprising at least a second electrode on a bottom surface of the piezoelectric layer.

2. The device of claim 1, wherein the shunt resonant tank further comprises a periodically modulated microelectromechanical (MEMS) resonator or an LC tank.

3. The device of claim 1, wherein the input switches and the output switches on each path are periodically modulated with a duty cycle to cover an entire modulation period.

4. The device of claim 1, wherein each of the plurality of shunt resonant tanks having a different center frequency.

5. The device of claim 4, wherein the different center frequencies of the plurality of shunt resonant tanks are equally spaced with respect to each other by three times a modulation frequency of the device.

6. The device of claim 1, further comprising:
a first matching inductor connected between the input port and the at least three parallel paths; and
a second matching inductor connected between the output port and the at least three parallel paths.

7. The device of claim 5, wherein each path includes seven shunt resonant tanks.

8. The device of claim 5, wherein the modulation frequency is 20 MHz.

9. The device of claim 3, further comprising circuitry in communication with the input and output switches to operate each of the input and output switches at a selected modulation period and a selected duty cycle.

10. The device of claim 9, wherein the modulation period is comparable to a time constant of the shunt resonant tanks.

11. The device of claim 9, wherein the duty cycle is selected based on a number of the shunt resonant tanks.

12. The device of claim 2, wherein each shunt resonant tank includes an electromechanical resonator or a resonant circuit.

13. The device of claim 12, wherein the resonant circuit includes a capacitor bank, back to back varactors, or reconfigurable resonators.

14. The device of claim 1, wherein the piezoelectric layer is a piezoelectric material selected from the group consisting of quartz, aluminum nitride, doped aluminum nitride, lithium niobate, lithium tantalite, zinc oxide, and gallium nitride.

15. The device of claim 1, wherein each input switch and output switch comprises a single pole single throw switch or a single pole double throw switch.

16. A method of operating a tunable delay circuit device comprising, providing the tunable delay circuit device including:
an input port;
an output port;
at least three parallel paths connecting the input port and the output port;
on each path, an input switch and an output switch; and
on each path, a plurality of shunt resonant tanks connected between the input switch and the output switch;
the method comprising:
operating the input and output switches to periodically charge each shunt resonant tank from the input port; and
operating the input and output switches to periodically discharge each shunt resonant tank to the output port; and introducing three low-loss poles into the device for each of the plurality of shunt resonant tanks.

* * * * *